(12) United States Patent
Houser et al.

(10) Patent No.: US 6,527,686 B1
(45) Date of Patent: Mar. 4, 2003

(54) VARIABLE PITCH SPINDLE LINE DRILLING MACHINE

(75) Inventors: David Erle Houser, Apalachin, NY (US); Joseph Duane Kulesza, Binghamton, NY (US); Candido Tiberia, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/496,488

(22) Filed: Feb. 2, 2000

(51) Int. Cl.[7] .............................................. B23Q 3/157
(52) U.S. Cl. .............................. 483/1; 483/34; 483/13; 483/37; 483/902; 33/639; 408/97; 294/104; 294/119.3; 294/902
(58) Field of Search ......................... 483/34, 901, 902, 483/13, 30, 36, 37–55, 11; 408/50, 51, 69, 97, 95; 294/103.1, 119.3, 104, 902; 33/639; 901/39, 41

(56) References Cited

U.S. PATENT DOCUMENTS

| | | | | |
|---|---|---|---|---|
| 3,327,386 A | * | 6/1967 | Jerue ............................ 483/34 |
| 4,041,601 A | * | 8/1977 | Schimanski .................. 483/45 |
| 4,108,486 A | * | 8/1978 | Hirmann ..................... 294/119.3 |
| 4,443,928 A | * | 4/1984 | Kielma ........................ 483/52 |
| 4,520,551 A | * | 6/1985 | Imhof .......................... 483/54 |
| 4,545,722 A | * | 10/1985 | Cutosky et al. ............. 294/104 |
| 4,596,067 A | * | 6/1986 | Raiteri ......................... 483/55 |
| 4,658,494 A | * | 4/1987 | Ohtani et al. ................ 483/51 |
| 4,715,108 A | | 12/1987 | Sugiyama et al. |
| 4,761,876 A | | 8/1988 | Kosmowski |
| 4,858,980 A | * | 8/1989 | Dreisig et al. .............. 294/99.1 |
| 4,869,626 A | | 9/1989 | Kosmowski |
| 4,922,603 A | | 5/1990 | Kosmowski |
| 4,932,117 A | | 6/1990 | Reed et al. |
| 5,068,958 A | | 12/1991 | Kosmowski |
| 5,147,160 A | | 9/1992 | Reed et al. |
| 5,216,818 A | * | 6/1993 | Rucinski et al. ............. 33/542 |
| 5,230,685 A | * | 7/1993 | Christen et al. ............. 483/55 |
| 5,249,348 A | * | 10/1993 | Hall ............................ 483/18 |
| 5,407,416 A | * | 4/1995 | Ottone et al. ................ 483/12 |
| 5,716,310 A | * | 2/1998 | Polacek et al. .............. 483/51 |
| 6,039,680 A | * | 3/2000 | Oketani et al. .............. 483/56 |

* cited by examiner

Primary Examiner—A. L. Wellington
Assistant Examiner—Erica E Cadugan
(74) Attorney, Agent, or Firm—Wood, Phillips, Katz, Clark & Mortimer (57) ABSTRACT

A movable spindle tool machine, such as a printed circuit board line drilling machine includes a base and a spindle mounted to the base. A magazine is mounted proximate the spindle for storing a supply of tools. A pitch independent tool changer is moveably mounted relative to the base for transferring tools from the magazine for insertion into the spindle. A tool locator is mounted in line with the spindle. The tool changer is operable to initially transfer a tool from the magazine to the tool locator to align the tool with the spindle and thereafter transfer the tool to the spindle for insertion into the spindle. The spindle is mounted to a nested outrigger guide. A positioning system can move two or more spindles simultaneously. A bit detector in a pressure foot button uses fiber optics to detect broken bits.

20 Claims, 5 Drawing Sheets

VARIABLE PITCH SPINDLE LINE DRILLING MACHINE

BACKGROUND OF THE INVENTION

This invention relates to movable spindle tool machines and, more particularly, to improvements in a movable spindle tool machine to satisfy increased throughput requirements.

FIELD OF THE INVENTION

A movable spindle tool machine in one form comprises a drilling machine. Drilling machines have been used, for example, for printed circuit board applications, such as in laminated chip carriers (LCC). Many of these machines include many spindles. The spindles are positioned during set-up to various locations. The most common type of drilling machine is a beam mounted machine that provides a single spindle for each work station. Each station acts on a workpiece at one time. Thus, if there are six stations, then there are six spindles. Another type of drilling machine used in high production operations is a matrix drilling machine. The spindles are provided in an array. The location of the spindles are not changed. The movable spindle LCC line driller is a cross between the traditional beam-mounted spindle drilling machine and air spindle matrix drillers. The line driller has the advantage of being able to automatically move the spindles to a fixed spacing that maximizes the hit rate based on the pitch of the LCC pattern on the panel.

In movable spindle tool machines of the type discussed the multiple spindles must be positioned prior to running the desired application. It is desirable to provide a means to automatically position the spindles. The conventional method is to provide a separate positioning system for each spindle. This can be expensive and requires a separate positioning system for each spindle which takes up a substantial amount of space. This minimizes the number of tools that can be used in a given area thereby limiting enhancements in machine productivity.

It is often necessary to replace a tool used in the spindle. This can be done manually. Advantageously, the process is automated. The spindle typically has a collet for holding the tool. The position of the tool must be located properly so that it can be inserted and maintained in the collet during a tool change operation. Also, the typical tool changers are adapted to change each tool independently. This can increase set-up time. Further, a drive system should operate independent of pitch.

In drilling machine applications it is important to determine if a drill bit is broken. Known methods range from microwave guide distortion, to acoustic vibration, to optical chip detectors. The most widespread method uses an optical through-beam pair of sensors to detect the presence or absence of the drill. However, to complicate the matters, drill bits sometimes only break off the tip of the drill. This has a tendency to fool most detectors because a through-beam pair typically looks higher up the drill flutes. Through-beam pairs are also limited by the minimum separation in the accuracy of alignment between the sender and receiver tips which impacts reliable detection of smaller drill diameters.

The present invention is directed to overcoming one or more of the problems discussed above, in a novel and simple manner.

SUMMARY OF THE INVENTION

In accordance with the invention, a movable spindle tool machine is adapted to increase production productivity.

In one aspect of the invention, a movable spindle tool machine includes a pre-spindle tool locator.

In another aspect of the invention, a movable spindle tool machine includes a positioning system for two or more movable assemblies.

In still another aspect of the invention, a movable spindle tool machine includes nesting movable tool carriages.

In accordance with still another aspect of the invention, a movable spindle tool machine includes a location independent tool or button changer for linear spindle arrays.

In accordance with a further aspect of the invention, a movable spindle tool machine includes a light pipe bit detector incorporated in a removable pressure foot button.

In one embodiment of the invention there is disclosed a movable spindle tool machine including a base and a spindle mounted to the base. A magazine is mounted proximate the spindle for storing a supply of tools. A tool changer is movably mounted relative to the base for transferring tools from the magazine for insertion into the spindle. A tool locator is mounted in line with the spindle. The tool changer is operable to initially transfer a tool from the magazine to the tool locator to align the tool with the spindle and thereafter transfer the tool to the spindle for insertion into the spindle.

There is disclosed in accordance with another embodiment of the invention a movable spindle tool machine including a base and a plurality of spindles. A plurality of bars, one for each spindle, and each supporting one of the spindles, are movably mounted to the base to position the spindles relative to one another. A drive assembly is mounted to the base for driving a linear actuator. Clamping means are operatively associated with each bar for selectively engaging the individual bars with the linear actuator to thereby selectively enable movement of the individual spindles relative to one another.

There is disclosed in accordance with a further embodiment of the invention a movable spindle tool machine including a base and a spindle mounted to the base. A magazine is mounted proximate the spindle for storing a supply of tools. A tool changer is movably mounted relative to the base for transferring tools from the magazine for insertion into the spindle wherein the tool changer comprises a relatively rigid fixed jaw and a relatively flexible movable jaw. An actuator selectively moves the movable jaw toward the fixed jaw to grip a tool therebetween.

There is disclosed in accordance with an additional embodiment of the invention a movable spindle tool machine including a base and a plurality of spindles. A plurality of carriages, one for each spindle and each supporting one of the spindles, are movably mounted to the base to position the spindles relative to one another. Each carriage comprises a narrow bar mounted to the spindle to provide minimal spacing between the spindles and an outrigger framework attached to the narrow bar to effectively increase the width of the bar. A linear drive stage is mounted to the base and the carriages for selectively positioning the spindles.

There is disclosed in accordance with yet another embodiment of the invention a spindle tool machine including a base and a spindle mounted to the base having a drill bit for drilling a workpiece. A pressure foot is operatively associated with the spindle to apply pressure to the workpiece during a drilling operation. The pressure foot includes a downwardly opening recess. A button is mountable in the pressure foot recess. The button comprises a two-piece button having first and second halves mateable to define a center opening for a drill bit. First and second light pipes are disposed between the two halves in alignment with each other and concentric with a center of the center opening. The light pipes are operatively associated with optical fibers for detecting a drill bit at the center opening.

Further features and advantages of the invention will be readily apparent from the specification and from the drawing.

DETAILED DESCRIPTION OF THE INVENTION

The invention relates to a printed circuit board line drilling machine adapted for use with a Laminated Chip Carrier (LCC). The illustrated line drilling machine has fifteen movable spindle capability. As described more particularly below, the spindles are arranged in a line across a beam and are moved to position and clamped in place before drilling. The spindles are mechanically clamped in place throughout the drilling process to yield superior hole location results over types of machines that can position spindles on every drill cycle. The spindles comprise air drive spindles which require no special water jacket for cooling and present no thermal intrusion of the beam which also improves location stability.

The spindle includes a pressure foot to clamp the panel. A bit detector is mounted in the pressure foot which can detect a 6-mil drill. The drill changer is mounted to the XY table and requires no adjustment for spindle spacing. A removable button is provided in the pressure foot which allows minimum clearance between the drill and pressure foot opening. A vacuum chuck is included which is used in conjunction with fixed locators. An XY table with 6×30" stroke is used to allow for manual tool change.

While the present invention is disclosed in connection with a line drilling machine, the various aspects of the invention can be used with other types of spindle tool machines or processing machines using multiple assemblies that have to be positioned prior to running the desired application, as will be apparent to those skilled in the art.

Figure 1:
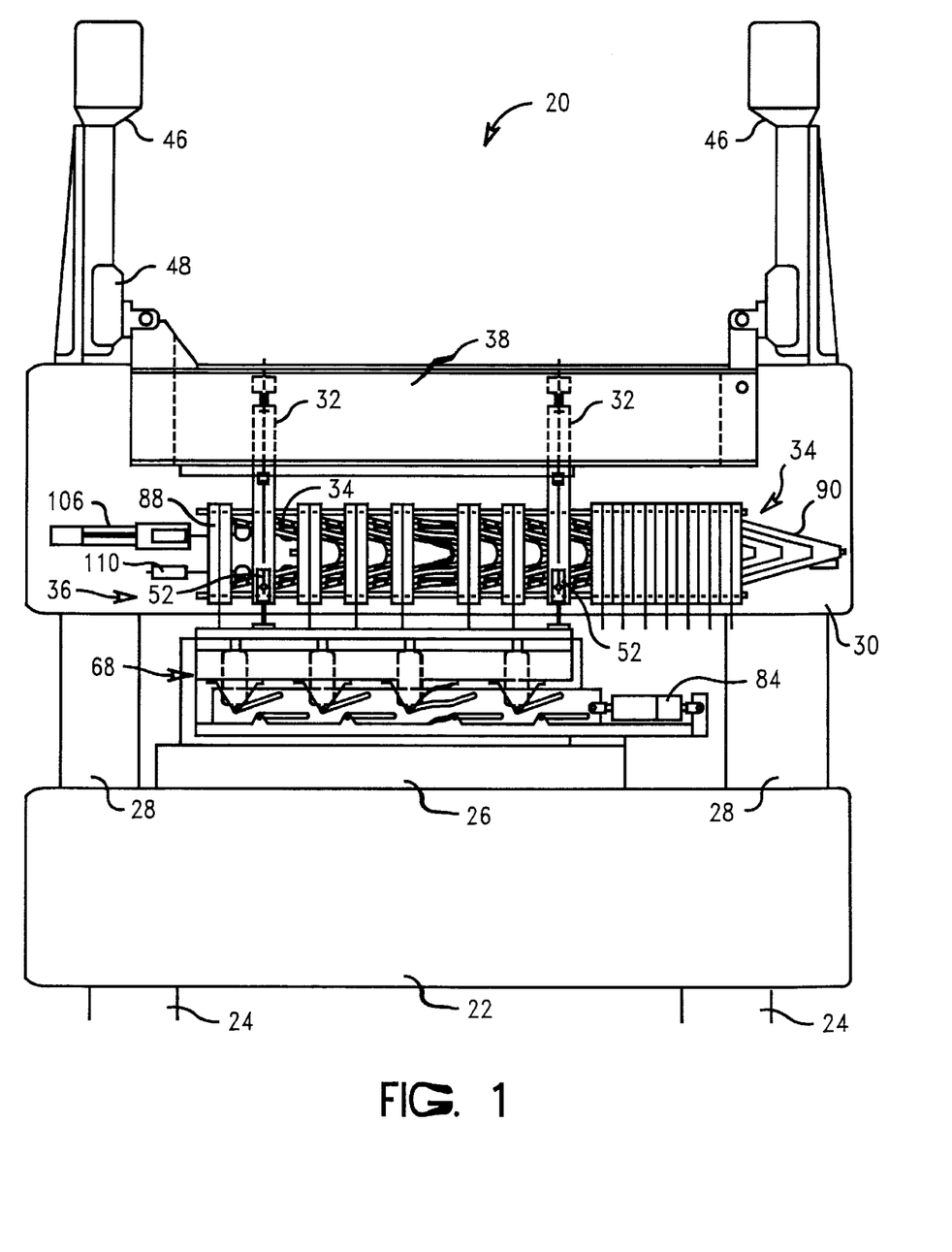
FIG. 1 is a front elevation view of a line drilling machine in accordance with the invention.
Figures 2, 3:
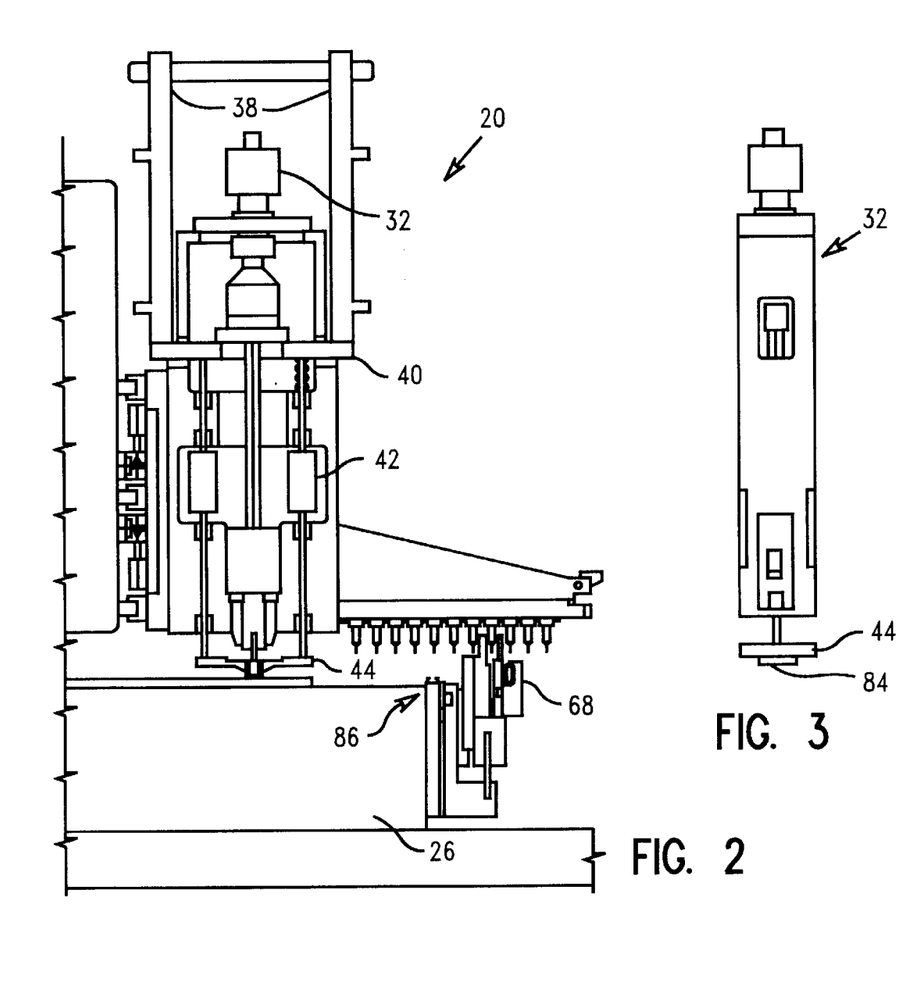
FIG. 2 is a left side elevation view of the line drilling machine of FIG. 1.
FIG. 3 is a front elevation view of a spindle block assembly used with the drilling machine of FIG. 1.

Referring to FIGS. 1–2, a line drilling machine 20 in accordance with the invention is illustrated. For clarity, various parts of the drilling machine 20 that do not relate to the various aspects of the present invention are omitted. Likewise, several of the views illustrated herein show only elements of the machine 20 relating to specific features to aid in understanding the operation of the various aspects of the drilling machine 20.

The line drilling machine 20 includes a lower base 22 supported on legs 24. The lower base 22 supports an XY table 26. Additionally, legs 28 extend upwardly from the lower base 22 to support an upper base 30 in the form of the beam. The beam 30 comprises a granite beam above the table 26 on the 24-inch side of a panel. This allows use of fifteen spindle block assemblies, referred to herein simply as spindle blocks, two of which are shown at 32. The spindle blocks 32 provide a minimum spacing of 1.5 inches. Each spindle block 32 is mounted to a carriage assembly 34. The carriage assemblies 34 are nestable, as described below, and move the spindle blocks 32 into position using a positioning system 36.

Z-axis motion is produced by a drive bar 38. The spindle blocks 32 are spring-loaded upwardly against the drive bar 38. The drive bar 38 pushes downward on contact points in the form of drive ears 40 built into the spindle block 32 shown in FIG. 2. The contact points in the spindle blocks 32 act downward through air cylinders 42 to actuate a pressure foot 44 mounted at the lower end of the spindle block 32 thereby improving drilling accuracy and eliminating fixed connections between the spindle block 32 and the Z actuator allowing a more freely movable spindle block 32. This eliminates or decouples the moment produced by the pressure foot 44 on the spindle block 32. The drive bar 38 is driven by drive stages 46 comprising lead screws acting through a linkage 48 to the drive bar 38. Thus, the drive bar 38 acts on plural spindle blocks 32 simultaneously, eliminating individual Z-axis servos as in prior systems.

The XY table 26 includes linear motors (not shown) on either side of each axis to produce a resulting drive. The structure of the XY table 26 may be conventional in nature and does not form part of the present invention. It is therefore not discussed in detail herein.

Figure 5:
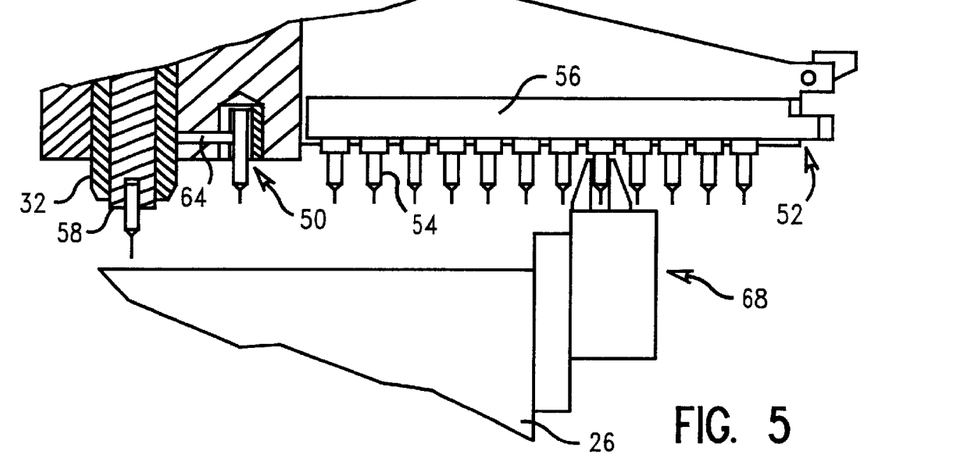
FIG. 5 is a side elevation view, with parts removed for clarity, illustrating a tool changer and pre-spindle tool locator in accordance with the invention.
Figures 6, 7:
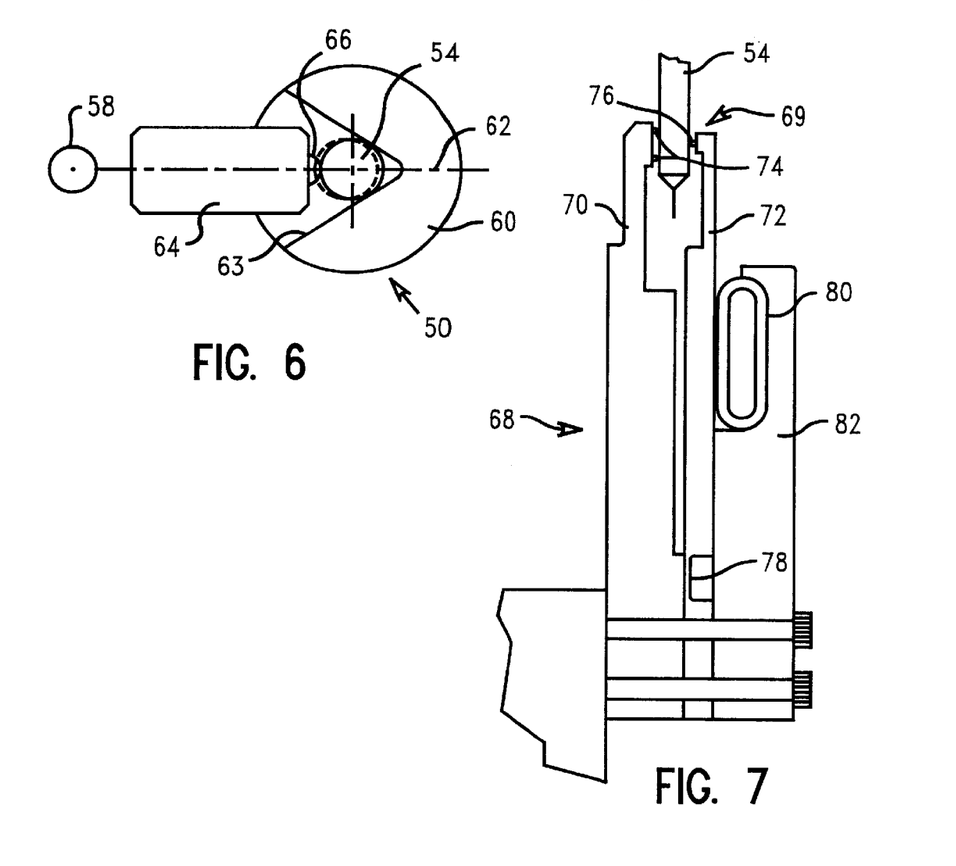
FIG. 6 is a bottom view illustrating the tool locator of FIG. 5.
FIG. 7 is a detailed side elevation view illustrating the tool changer in accordance with the invention.

Referring to FIGS. 5 and 6, a pre-spindle tool locator 50 in accordance with the invention is illustrated. The tool locator 50 is mounted frontwardly of the spindle block 32. A magazine in the form of a drill clip 52 extends frontwardly of the spindle block 32 and provides up to twelve (12) tools in the form of drills, also referred to as drill bits, 54 in a plastic holder 56. The drill bits 54 are in a line and are generally in alignment with the bit locator 50 and a collect 58 of the spindle block 32.

FIG. 5 illustrates a single spindle block 32 with the tool locator 50 and the magazine 52. In addition, a tool locator 50 and magazine 52 are provided for each spindle block 32.

Referring specifically to FIG. 6, the bit locator 50 comprises a "V" block 60 mounted in the spindle block 32 in precise relation to the collect 58. Particularly, a center line 62 passing through a center of a V opening 63, and intersecting a vertex of the "V" block 60, is aligned with a center of the collect 58. A ball plunger 64 having a spring-loaded ball 66 is positioned in the V opening 63. The ball plunger 64 serves to push the tool 54 in contact with the V opening 63 thereby locating it both laterally and angularly when the tool 54 is released by a tool changer 68. The travel of the ball 66 allows the tool 54 to be inserted into the device with a substantially more "off" location than the spindle block 32 would allow as is shown by the dotted lines on the view of FIG. 6.

The tool changer 68 is mounted to the XY table 26. In operation, the tool changer 68 moves up and grips a tool 54 from the clip 52 and moves rearwardly to a location below the bit locator 50. The tool 54 is then inserted in the bit locator 50 and the tool changer 68 ungrips the tool 54 to allow the bit locator 50 to properly position it. The realigned tool 54 is then regripped and lowered and moved further rearwardly to be inserted in the collect 58.

Referring to FIG. 7, the tool changer 68 is illustrated in greater detail. Rather than using individual tool changers associated with each spindle block 32, as is on a conventional multiple spindle per station, adjustable spindle drill machine or router, the tool changer 68 is a single entity which changes tools on any number of spindles 32 on any spacing within a certain linear space. In the illustrated embodiment of the invention, if fifteen spindle blocks are used for performing a drilling operation, then the tool changer 68 can change tools for all fifteen simultaneously. In the illustration in FIG. 1, the eight left-most carriage assemblies 34 are in position where tools could be changed for associated spindle blocks 32. The remaining seven carriage block assemblies 34, and their associated spindle blocks, not shown, are in an unused spindle storage area.

The tool changer 68 uses jaws 69 defined by a fixed jaw or blade 70 and a movable jaw or blade 72. The fixed jaw 70 is relatively rigid. The movable jaw 72 is relatively flexible. The tools 54 are gripped by pushing the movable jaw 72 towards the fixed jaw 70. The rigidity of the fixed jaw 70 determines the tool location left and right while the flexibility of the movable jaw 72 assures that all tools 54 are gripped securely.

Two lobes 74 on the fixed jaw 70 and a single lobe 76 on the movable jaw 72, positioned vertically between the lobes 74, assure a sufficient resistance to force that may be applied to the tool 54 perpendicular to the cross-section.

In the illustrated embodiment of the invention, the movable jaw 72 uses a flexure 78 at a lower end to allow it to be pushed toward the fixed jaw 70. Alternatively, any type of continuous hinge could be used. The movable jaw 72 is actuated by pressurizing a flexible oval tube 80, backed up by a fixed member 82. Any type of actuator that applies a substantially constant force per unit length could be used in place of the oval-shaped tube 80.

The tool changer 68 is mounted on the XY table 26. In the illustration of FIG. 1, the tool changer is positioned below eight of the carriage assemblies 34. Assuming each carried a spindle block 32, the tool changer 68 would be operated to change eight tools simultaneously. After the spindle spacing has been set up, the open jaws 69 would move under the desired drill position 54 in the drill clips 52. The tool changer 68 would then move upwardly relative to the tool clip 52. The jaws 69 would be closed and then moved away from the tool clip 52, pulling the desired tools 54 from the magazine 52. In this manner the spacing of the tools 54 in the jaws 69 is determined by the spacing of the spindles 32.

After locating the drills precisely relative to each spindle using the locators 50, as discussed above, the jaws 69 move under the spindles 32 and then move up. After the collets 58 are tightened around the tools 54, then the jaws open and move down so that machining may proceed. To put used tools 54 back into the magazine 52, the process is reversed without the step using the bit locator 50.

The tool changer 68 could also be used for changing the removable button 84. Alternatively, a similar device 86, see FIG. 2, can be separately secured to the XY table 26 for changing the button 84. The tool changer Z drive system is used to raise and lower the tool changer 68. It can be implemented in a number of conventional ways and therefore is not considered part of this invention.

Figure 4:
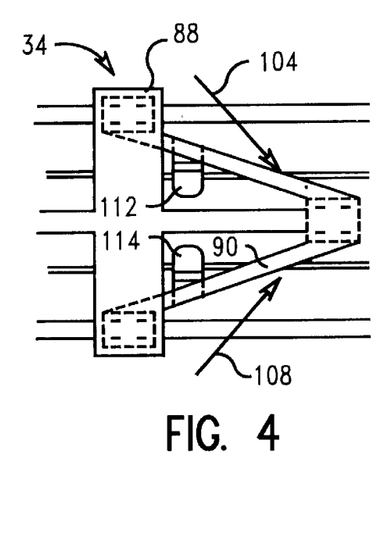
FIG. 4 is a front view specifically illustrating a carriage assembly for holding the spindle block assembly of FIG. 3.
Figure 10:
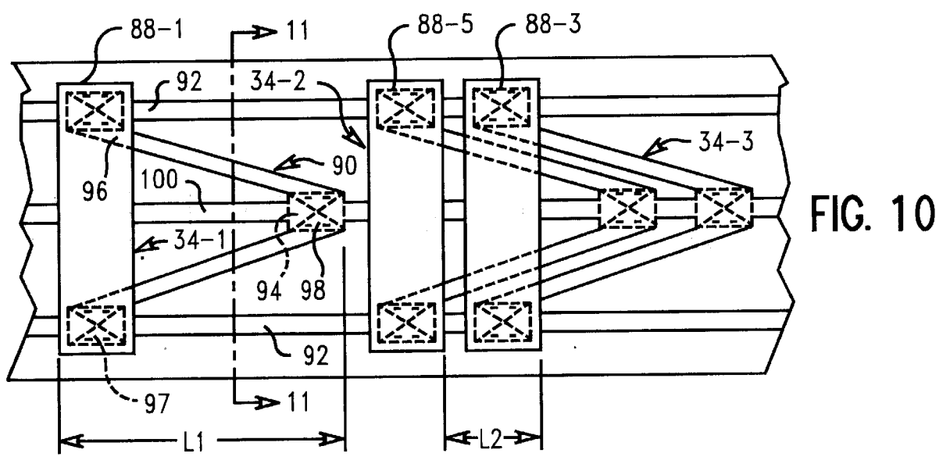
FIG. 10 is a front elevation view, similar to that of FIG. 8, with parts removed for clarity, illustrating the nesting of movable tool carriages in accordance with the invention.
Figure 11:
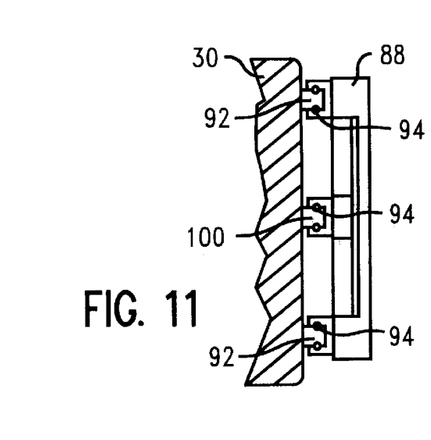
FIG. 11 is a sectional view taken along the line 11—11 of FIG. 10.

Referring to FIGS. 4, 10 and 11, each carriage assembly 34 comprises a narrow bar 88 and an outrigger framework 90. The narrow bar 88 has a width corresponding to that of the spindle block 32. This allows the spindle blocks 32 to be spaced closely together. The outrigger framework 90 acts as a stabilizer arm and increases effective width of the bar 88 to provide required rigidity to process the part accurately. Referring to FIG. 10, a first carriage 34-1 is shown unnested. The width of the carriage 34-1 is defined by the distance L1. The relationship between carriages 34-2 and 34-3 shows how carriages can be nested on centers defined by an effective width L2 much smaller than the width L1.

Each narrow bar 88 comprises a block that slides on opposite outer rails 92 using linear bearings 94. The rails 92 are fastened to the beam 30. The outrigger framework 90 comprises a V-shaped bar having ends 96 secured to the opposite ends of the narrow bar 88. The V-bar 90 has a center portion 98 slideably mounted to a center rail 100 using a linear bearing 94. The center rail 100 is fastened to the beam 30 centrally disposed between the outer rails 92.

Thus, the carriage assemblies 34 use a relatively narrow bar to provide minimal spacing between the spindle blocks 32 and the V-bar framework effectively increases width of the bar 88 to provide rigidity.

Figure 8:
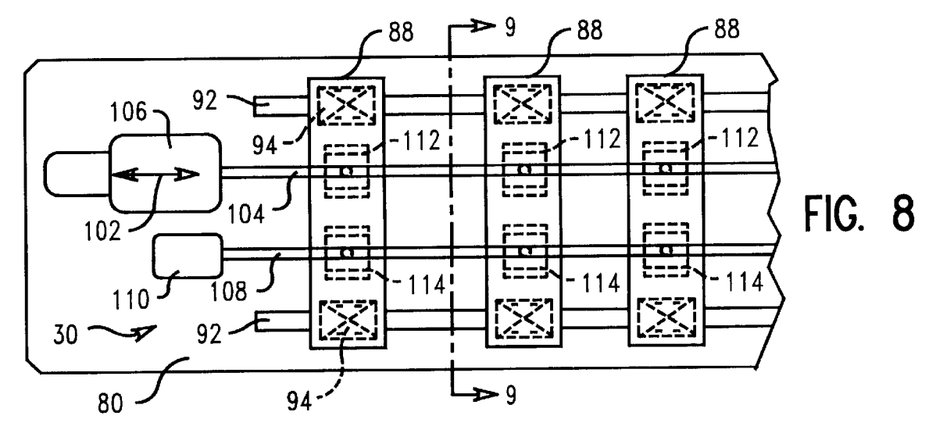
FIG. 8 is a front elevation view, with parts removed for clarity, illustrating a positioning system in accordance with the invention.
Figure 9:
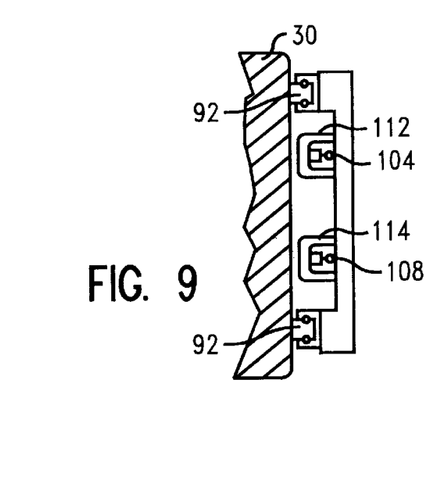
FIG. 9 is a sectional view taken along the line 9—9 of FIG. 8.

Referring to FIGS. 8 and 9, the positioning system 36 is illustrated in greater detail. In this illustration the V-bars 90 are omitted from the carriages 34 for clarity.

FIG. 8 illustrates three of the narrow bars 88 of three corresponding carriage assemblies 34 attached to the base 30 with the linear bearings 94 and rails 92 to allow motion in the direction shown by the arrow 102. An assembly drive rod 104 is attached to a single positioning system 106 which contains drive means, such as a linear motor, rotary motor and lead screw, etc., and usually a position feedback means, such as an optical encoder, magnetic encoder, etc. The positioning system 106 is affixed to the beam 30. A fixed rod 108 is mounted to the beam 30 by a block 110 on each end, only one of which is shown. The fixed rod 108 is used to hold the movable carriage assemblies 34 in place while other carriage assemblies are being moved. The fixed rod 108 has a small diameter and is mounted in tension which allows it to thermally conform to the beam 30. A drive clamp 112 is permanently attached to each narrow bar 88 and can be selectively actuated and released to clamp or release the drive rod 104. Similarly, a fixed clamp 114 is permanently attached to each narrow bar 88 and can be selectively actuated and released to a clamp or release the fixed rod 108.

In the illustration of FIGS. 8 and 9, the clamps 112 and 114 are shown secured to the bar 88. In an alternative configuration, as shown in FIG. 4, the clamps 112 and 114 are secured to the V-bar framework 90.

When the carriage assemblies 34 are all at rest, the fixed clamps 114 are all actuated to hold the carriage assemblies 34 in position, see FIG. 9. When it is desired to move an assembly to a new position, the drive clamp 112 on that particular carriage assembly 34 is turned on. The corresponding fixed clamp 114 is turned off. The positioning system 106 moves the desired incremental amount taking the particular assembly 34 with it. Once in the desired position, the fixed clamp 114 is turned on and the drive clamp 112 is turned off to complete the assembly move cycle. In this manner any number of carriage assemblies 34 can be moved selectively one at a time or in groups by means of a single positioning system 106. Additionally, each carriage assembly 34 is rigidly clamped while in process as opposed to being held on location by a servo control loop.

Figure 12:
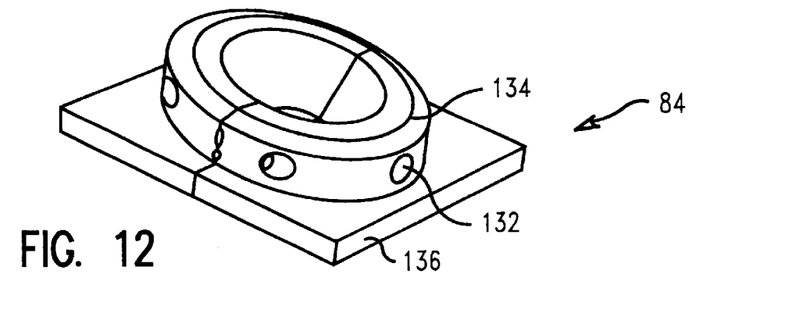
FIG. 12 is a perspective view illustrating a button in accordance with the invention.
Figure 13:
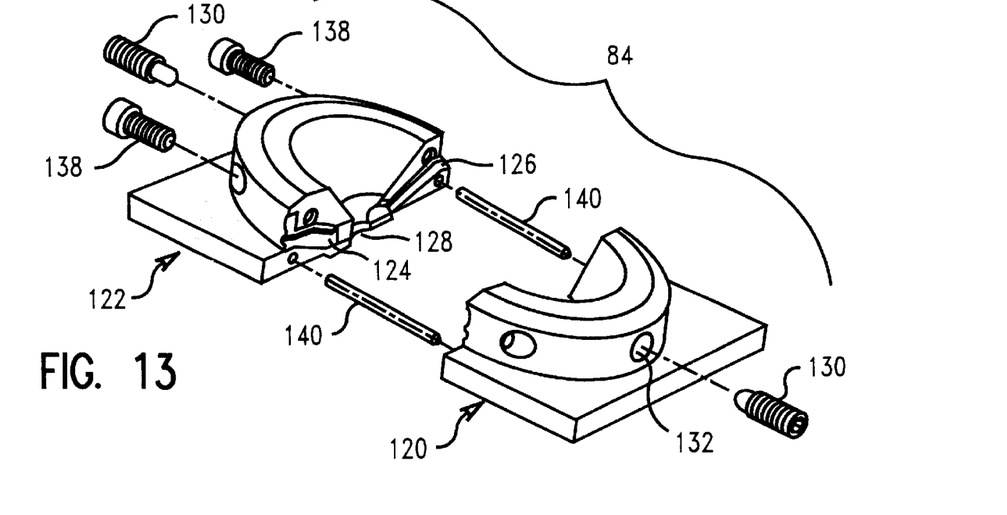
FIG. 13 is a perspective exploded view of the button of FIG. 12.

Referring to FIGS. 12 and 13, the pressure foot button 84 is illustrated in detail. The pressure foot button 84 is provided in two halves 120 and 122. This allows the path or track where a light pipe is placed to be located with a high degree of accuracy. Particularly, a light pipe sender 124 and a light pipe receiver 126 extend downwardly at an angle towards a center opening 128. The sender and receiver light pipes 124 and 126 are machined in alignment with each other and concentric with the center of the pressure foot 44 which is the drill location. The button 84 is held in the pressure foot 44 on location by a set of opposing Vlier screws 130 that seat on depressions 132 in an outer barrel 134 of the button 84. The depressions 132 are machined so that the Velier screws 130 bias the button 84 up against the pressure foot 44 and to resist rotation of the button 84. The button 84 has a face 136 that is square to enable more positive gripping of the buttons by parallel jaws of the pressure foot button changer 86.

The two button halves 120 and 122 are held together using fasteners 138 with dowel pins 140 in the face 136 maintaining the proper positioning.

Figure 14:
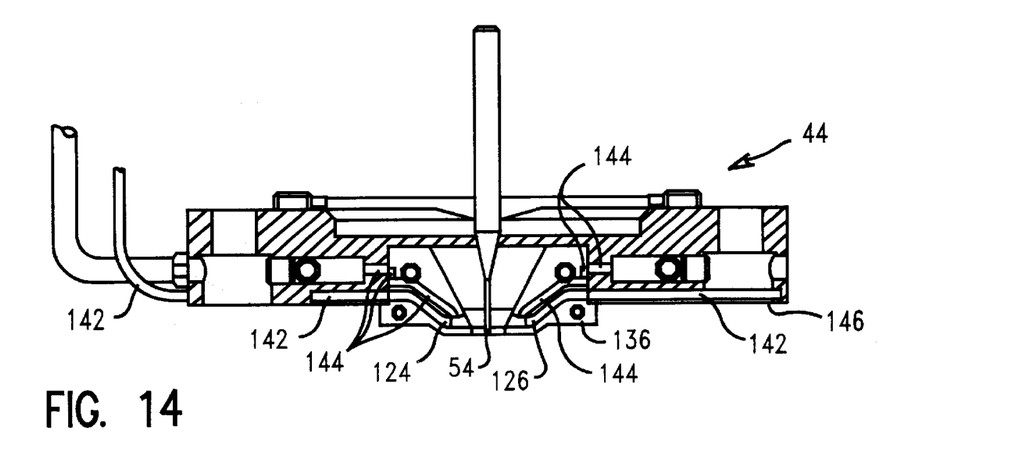
FIG. 14 is a sectional view of a pressure foot holding the button of FIG. 12.

Referring to FIG. 14, the button 84 is shown mounted in the pressure foot 44. The light pipe sender and receiver 124 and 126 mate with an optical fiber bundle 142 which carries light signals several feet back to an LED emitter and photocell. It is necessary for the light to jump the gap between the fiber bundle 142 and the light pipe sender and receiver 124 and 126. The throughbeam pair can detect a 4-mil target with a separation of 1.8 inches. The separation in the illustrated configuration is about 190 mils. Also, the expected diameter of the light bundle 142 is 15 mils where the light pipe diameter is about 40 mils. The light pipe 124 and 126 does not need a jacket and can be significantly smaller than the fiber bundle 42 thereby reducing the criticality of alignment across the gap. Air blowoff ports 144 are provided to keep the light pipes 124 and 126 free of debris. By angling the light pipes 124 and 126 downwardly below an outer surface 146 of the pressure foot 44, the sensing plane is moved down to the very tip of the drill 54 improving the chance of detecting a broken tip without adding excessive drill stroke. As can be seen, the button face 136 is disposed below the pressure foot lower surface 146.

As is apparent, the drilling machine 20 uses various additional structure for its intended operation. Because such structure is unrelated to the invention, it is not illustrated or specifically discussed herein. The various controlled elements are controlled by a personal computer or the like connected via input/output interface circuits to the particular controlled devices. The controller is programmed accordingly for the necessary operation.

Thus, in accordance with the invention there is provided a movable spindle tool which implements a pre-spindle tool locator, a spindle positioning system, the use of nesting movable carriages, a multiple tool changer and a pressure foot button light pipe broken bit detector in accordance with the invention.

What is claimed is:

1. A movable spindle tool machine comprising:
   a base;
   a spindle mounted to the base;
   a magazine mounted proximate the spindle for storing a supply of tools;
   a tool changer movably mounted relative to the base for transferring tools from the magazine for insertion into the spindle; and
   a tool locator fixedly mounted relative to the spindle and in line with the spindle,
   wherein the tool changer is operable to initially transfer one of the tools from the magazine to the tool locator to align the one tool with the spindle and thereafter transfer the one tool from the tool locator to the spindle for insertion in the spindle.

2. The movable spindle tool machine of claim 1 wherein the tool locator comprises a V block and a plunger operable to push the one tool in contact with the V block locating the one tool both laterally and angularly relative to an axis of the spindle.

3. The movable spindle tool machine of claim 2 wherein the plunger comprises a spring loaded ball plunger.

4. The movable spindle tool machine of claim 2 wherein a vertex of the V block is aligned with a center axis of the spindle.

5. A movable spindle line drilling machine comprising:
   a base;
   a plurality of spindles moveably mounted relative to the base in a linear alignment;
   a magazine mounted proximate said spindles for storing a supply of drills;
   a drill changer movably mounted relative to the base for transferring drills from the magazine for insertion into the spindles; and
   a plurality of drill locators each fixedly mounted relative to an associated one of the spindles and in line with the associated one of the spindles,
   wherein the drill changer is operable to initially transfer a plurality of the drills from the magazine each to one of the plurality of drill locators to align each of the plurality of drills with the associated ones of the spindles and thereafter transfer each aligned drill from the one of the plurality of drill locators to the associated spindle for insertion in the associated spindle.

6. The movable spindle line drilling machine of claim 5 wherein each drill locator comprises a V block and a plunger operable to push one of the drills in contact with the V block locating the drill both laterally and angularly relative to an axis of the associated spindle.

7. The movable spindle line drilling machine of claim 6 wherein the plunger comprises a spring loaded ball plunger.

8. The movable spindle line drilling machine of claim 6 wherein a vertex of each V block is aligned with a center axis of the associated spindle.

9. The movable spindle line drilling machine of claim 5 wherein each of the plurality of spindles is movable to a respective drilling position, and the drill changer comprises an elongate fixed jaw and an elongate movable jaw, a length of each jaw being greater than a length of a linear space occupied by those of the plurality of aligned spindles that are arranged in their drilling position, and said jaws being in parallel with the aligned spindles.

10. The movable spindle line drilling machine of claim 9 wherein the drill changer comprises an actuator to selectively close and open the movable jaw relative to the fixed jaw.

11. The movable spindle line drilling machine of claim 5 wherein the magazine comprises a plurality of drill clips, one for each said spindle, each drill clip holding a plurality of drills.

12. A movable spindle line drilling machine comprising:
a base;
a plurality of spindles moveably mounted relative to the base in a linear alignment, wherein each of the plurality of spindles is movable to a respective drilling position;
a magazine mounted proximate said spindles for storing a supply of drills; and
a drill changer movably mounted relative to the base for transferring drills from the magazine for insertion into the spindles wherein the drill changer comprises an elongate fixed jaw and an elongate movable jaw, a length of each said jaws being greater than a length of a linear space occupied by those of the plurality of the aligned spindles that are arranged in their drilling position, and said jaws being in parallel with the aligned spindles, and an actuator for selectively moving the movable jaw towards the fixed jaw to grip a plurality of drills therebetween.

13. The movable spindle line drilling machine of claim 12 wherein the magazine comprises a plurality of drill clips, one for each said spindle, each drill clip holding a plurality of drills.

14. The movable spindle tool machine of claim 12 wherein the drill changer includes a pair of elongate lobes on the fixed jaw and an elongate lobe on the movable jaw, aligned between the fixed jaw lobes.

15. The movable spindle tool machine of claim 12 further comprising a plurality of drill locators each mounted in line with an associated one of the spindles, wherein the drill changer is operable to initially transfer a plurality of the drills from the magazine each to one of the drill locators to align each of the plurality of drills with the associated spindles, and thereafter transfer the drills for insertion in the associated spindles.

16. The movable spindle tool machine of claim 12 wherein the drill changer is mounted to a positioning table that moves a workpiece relative to the spindles.

17. The movable spindle tool machine of claim 12 wherein the movable jaw comprises an elongate bar having a flexure enabling the movable jaw to be pushed toward the fixed jaw.

18. The movable spindle tool machine of claim 12 wherein each spindle is operatively associated with a pressure foot having a removable button, and the tool changer is operable to remove the associated button.

19. A method to change buttons in a linear spindle tool comprising the steps of:
providing a base;
providing at least one spindle mounted to said base;
transferring a removable button for insertion into a pressure foot of said at least one spindle with a tool changer movably mounted relative to said base, the button having a face that is square to provide positive gripping, by parallel jaws of the tool changer; and
removably holding the removable button in the pressure foot.

20. A method to transfer tools from a magazine to a spindle of a movable spindle tool machine comprising the steps of:
providing a base;
providing at least one spindle mounted to said base;
providing a tool locator fixedly mounted relative to the at least one spindle;
storing a supply of tools in a magazine mounted proximate to said at least one spindle; and
transferring one of said tools from said magazine for insertion into said at least one spindle with a tool changer movably mounted relative to said base, including
transferring said one tool from said supply of tools in said magazine to said tool locator with said tool changer,
aligning said one tool to said spindle with said tool locator, and
transferring said one tool from said tool locator and inserting said tool in said at least one spindle with said tool changer.

* * * * *